United States Patent [19]

Tzeng

[11] Patent Number: 5,215,934

[45] Date of Patent: Jun. 1, 1993

[54] PROCESS FOR REDUCING PROGRAM DISTURBANCE IN EEPROM ARRAYS

[76] Inventor: Jyh-Cherng J. Tzeng, 825 Gary Ave., Sunnyvale, Calif. 94086

[21] Appl. No.: 455,510

[22] Filed: Dec. 21, 1989

[51] Int. Cl.$^5$ .................................. H01L 21/265
[52] U.S. Cl. ...................................... 437/43; 437/24; 437/45; 437/48; 437/49; 437/979; 437/983; 148/DIG. 117
[58] Field of Search ............... 437/24, 43, 45, 48, 437/49, 52, 979, 983; 148/DIG. 117

[56] References Cited

U.S. PATENT DOCUMENTS

| | | | |
|---|---|---|---|
| 4,011,576 | 3/1977 | Uchida et al. | 357/23 |
| 4,016,588 | 4/1977 | Ohya et al. | 357/23 |
| 4,203,158 | 12/1978 | Frohman-Bentchkowsky et al. | 365/185 |
| 4,420,871 | 12/1983 | Scheibe | 437/43 |
| 4,642,881 | 2/1987 | Matsukawa et al. | 437/43 |
| 4,698,787 | 10/1987 | Mukherjee et al. | 365/185 |
| 4,924,437 | 5/1990 | Paterson | 365/185 |

FOREIGN PATENT DOCUMENTS

| | | |
|---|---|---|
| 0086372A2 | 8/1983 | European Pat. Off. . |
| 0247875A2 | 12/1987 | European Pat. Off. . |
| 57-76877 | 5/1982 | Japan ................... 437/43 |
| 1315230 | 5/1973 | United Kingdom . |
| 2107519A | 4/1983 | United Kingdom . |
| 2234834A | 5/1990 | United Kingdom . |

OTHER PUBLICATIONS

"VLSI Technology", edited by Sze, M. C., McGraw Hill Book Company, 1983, pp. 145-149.

Primary Examiner—Olik Chaudhuri
Assistant Examiner—G. Fourson

[57] ABSTRACT

A method by which the gate oxide in an EEPROM device is selectively thickened over the channel region nearest to the drain so as to penalize erase-type behavior during programming of a selected cell. First the lattice structure in a portion of the channel near said drain region is intentionally damaged to enhance subsequent thermal oxidation therein. Next, the channel is thermally oxidized to form the tunnel oxide for the device. Due to the damage inflicted in the portion of the channel near the drain, the tunnel oxide over the damaged region is thicker relative to the other portion of the channel. A thicker gate oxide near the drain thwarts drain disturbance in adjacent memory cells while speeding up source erase performance.

26 Claims, 3 Drawing Sheets

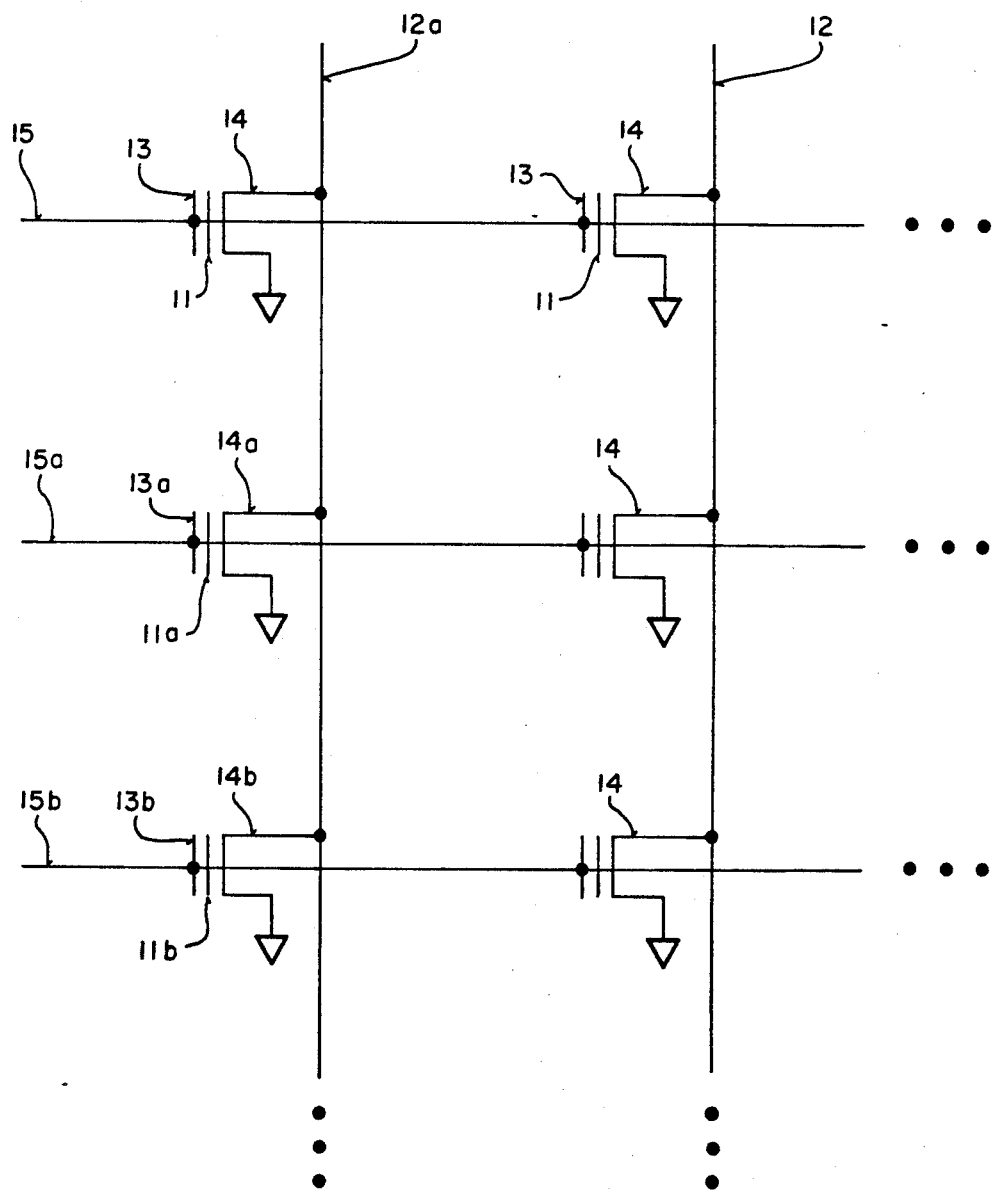
FIG_1

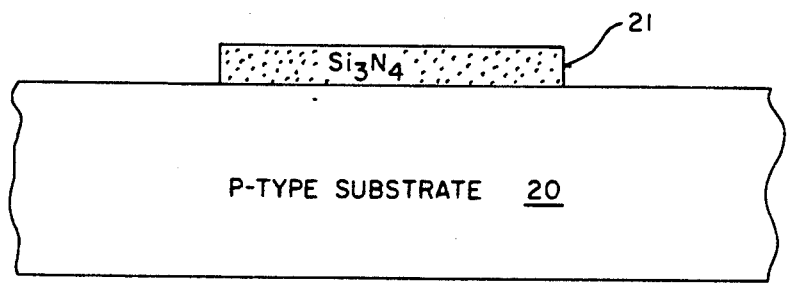
FIG_2
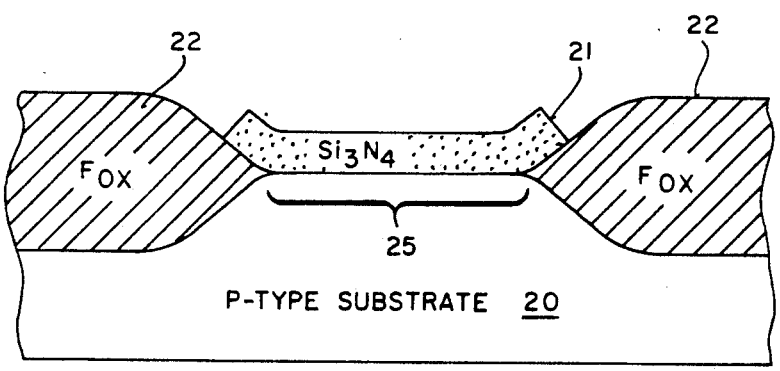
FIG_3
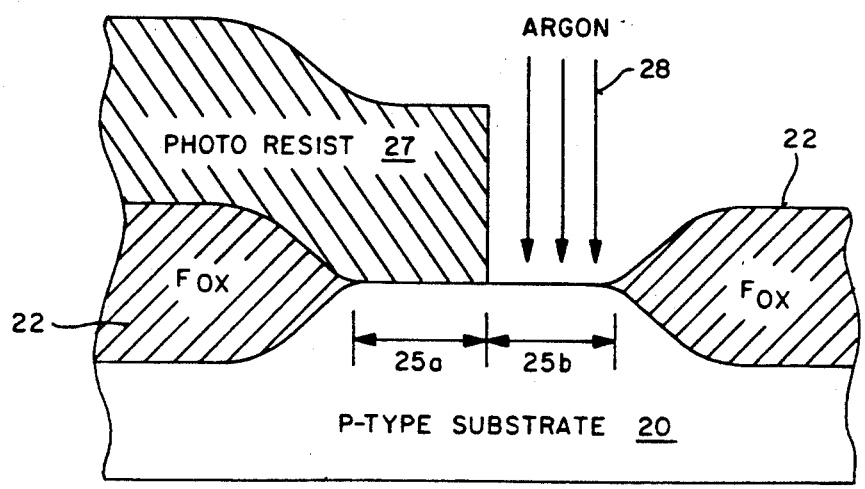
FIG_4

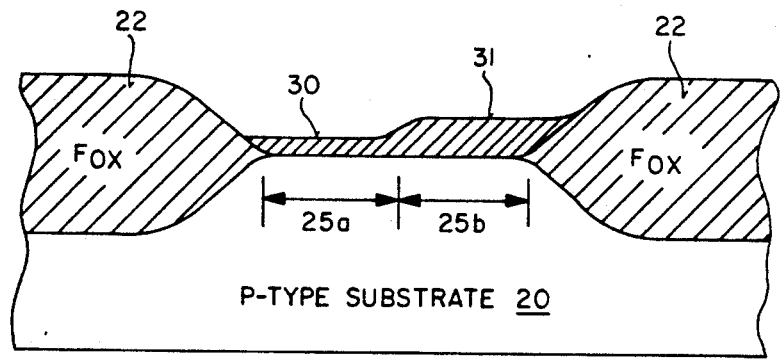
FIG_5
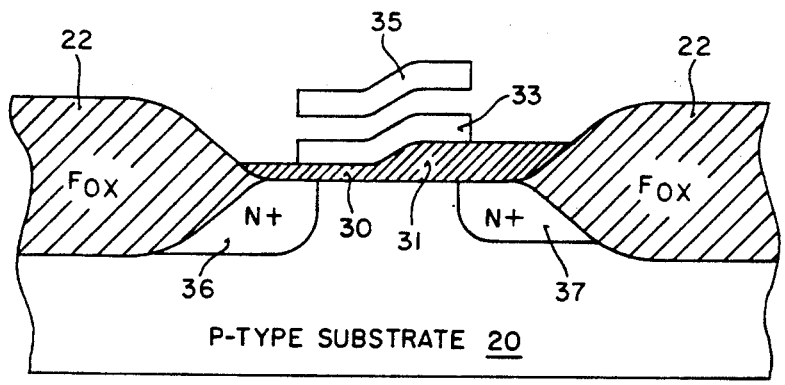
FIG_6
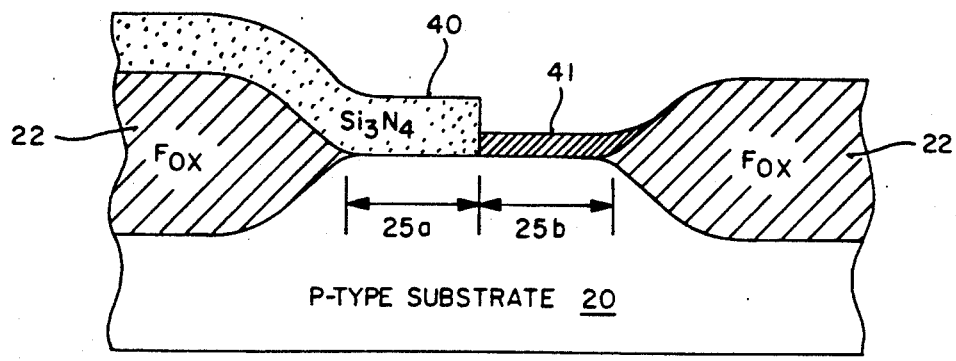
FIG_7

PROCESS FOR REDUCING PROGRAM DISTURBANCE IN EEPROM ARRAYS

FIELD OF THE INVENTION

The present invention relates to the fabrication of electrically programmable memory devices of the type commonly referred to as Electrically Erasable Programmable Read-Only Memories (EEPROMS).

BACKGROUND OF THE INVENTION

Memory cells which have members that may be electrically charged are well-known in the prior art. Most often, these cells employ polysilicon floating gates which are completely surrounded by insulation (e.g., silicon dioxide). A charge is transferred to these floating gates through a variety of mechanisms such as avalanche injection, channel injection, tunnelling, etc. The charge on the floating gate affects the surface channel conductivity in the cell. If the conductivity is above a certain level, the cell is deemed to be programmed in one binary state, and if the conductivity is below another level, it is deemed to be programmed in the other binary state. These cells take a variety of forms in the prior art, some being both electrically erasable and electrically programmable, and others requiring, for example, ultraviolet light for erasing. The cells are incorporated into memories referred to in the prior art as EPROMs, EEPROMs, flash EPROMs and flash EEPROMs.

In general, an EPROM or an EEPROM is characterized by a substrate region including source and drain regions which define a channel therebetween. Disposed above this channel is a floating gate separated from the substrate region by a relatively thin gate insulative material. Typically, a layer of silicon dioxide is employed. A control gate is disposed above, and insulated from, the floating gate. The control gate is also commonly fabricated of polycrystalline silicon, i.e., polysilicon.

An example of a flash EEPROM cell is provided in FIG. 10 of U.S. patent application entitled "Low Voltage EEPROM Cell", Ser. No. 07/253,775, filed Oct. 5, 1988, still pending, which application is assigned to the assignee of the present invention. The principle upon which the EEPROM cell of FIG. 10 operates is that electrons (i.e., charge) are stored on the floating gate in a capacitive manner.

By way of example, during programming of the EEPROM device, the control gate is taken to a high positive potential ranging between 12 and 20 volts. The source is grounded and the drain is taken to an intermediate potential of approximately 7 volts. This creates a high lateral electric field in the channel region nearest to the drain. The high lateral electric field (i.e., "E-field") accelerates electrons along the channel region to the point were they become "hot". These hot electrons create additional electron-hole pairs by impact ionization. A large number of these electrons are attracted to the floating gate by the large positive potential on the control gate.

During erasing of the EEPROM device, the control gate is grounded and the drain is left unconnected (i.e., floating). The source is taken to a high positive potential around 12 Volts. This creates a high vertical E-field from the source to the control gate. Charge is erased from the floating gate by the mechanism of Fowler-Nordheim tunnelling of electrons through the gate oxide region between the source and the floating gate in the presence of such a field.

Note that in the memory cell of FIG. 10 of the above-referenced application, the source region is deeper and more graded when compared to the drain region. Observe also that the source region, because of its graded profile, extends further under the floating gate. The primary reason why the drain is fabricated to be shallower and more abrupt than when compared to the source is that hot electron generation is lateral channel E-field dependant. Thus, the drain region is intentionally given an abrupt junction to generate a high electric field in order to create a large supply of hot electrons.

On the other hand, the source region is graded to decrease the local electric field strength across the source/substrate junction during erase. This allows a 12 Volt or higher voltage to be applied to the source for erasure without breakdown. Note that while hot electron programming is entirely lateral channel E-field dependant, tunnelling from the source region is subject to vertical E-field control, which is tunnel oxide thickness dependant.

One problem that arises with electrically programmable memory cells of the variety described above is the unintentional disturbance to the drain region of an adjacent cell. This adjacent cell is usually located in the same column as is the cell which is being programmed. By way of example, when arranged in rows and columns, adjacent cells within a particular column will often have their drain terminals connected to a single column line.

To program an individual cell within a column, the common column line is raised to a high potential. The sources of the cells are grounded. The selected cell to be programmed has its control gate raised to a high positive potential while all other cells within that column have their control gates grounded. Drain disturbance refers to the phenomena by which adjacent cells within a column may become partially or totally erased as a result of the programming potential being applied to the drain regions along the common column line connected to those cells.

To penalize such "erase-like" behavior in these adjacent cells, the gate oxide separating the substrate from the floating gate can be thickened. While such thickening has no affect on hot electron programming characteristics, it does reduce erasing efficiency—which is strongly gate oxide thickness dependant. Thus, while it is desired to optimize erase capabilities from the source region by maintaining the gate oxide thickness as thin as possible, it is also desired to thicken the gate oxide nearest the drain region to prevent drain disturbance phenomena. Therefore, what is needed in the art is a process for reducing drain disturbance during programming without interfering with the erasing characteristics of the cell.

As will be seen, the present invention provides a method by which the gate oxide may be selectively thickened over the channel region nearest to the drain so as to penalize erase-type behavior leading to drain disturbance. At the same time, the gate oxide thickness nearest to and/or directly over the source region is maintained as thin as possible to maintain fast erasing properties. The result is a two-tiered gate oxide structure which is easily incorporated as a process module into any conventional EPROM or EEPROM process flow.

Other prior art known to Applicant includes U.S. Pat. No. 4,698,787 of Mukherjee et al., which discloses an electrically erasable programmable memory device which is also programmed by hot electron injection onto a floating gate, and erased by Fowler-Nordheim Tunnelling to the source region. The effect of impurities and damage on the oxidation rate of silicon is discussed in "VLSI Technology" edited by Sze, M. C., McGraw Hill Book Company, 1983, pp. 145-149.

SUMMARY OF THE INVENTION

A method by which the gate oxide in an EEPROM device is selectively thickened over the channel region nearest to the drain so as to penalize erase-type behavior leading to drain disturbance is disclosed. In the preferred embodiment, the invented method is incorporated as a process module in a process for fabricating an array of electrically programmable and electrically erasable read-only memory cells. The memory cell are the type which include a floating gate and which are programmed by hot electron injection near the drain region and erased by Fowler-Nordheim tunneling near the source.

The invented method for reducing drain disturbance in adjacent cells within the array during programming of a selected cell comprises the following steps. First, the lattice structure in a portion of the channel near said drain region is intentionally damaged so as to enhance subsequent thermal oxidation therein. Following the damaging step the channel is thermally oxidized to form the tunnel oxide for the device. Due to the damage inflicted in the portion of the channel near the drain the tunnel oxide over that region is thicker relative to the remainder of the channel. This has the salutary effect of inhibiting Fowler-Nordheim tunnelling of electrons from the floating gate to the drain, which reduces drain disturbance in the cells while increasing the source erase speed.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein;

FIG. 1 is a portion of a memory array formed of rows and columns of electrically programmable and electrically erasable read-only memory (EEPROM) cells.

FIG. 2 is a cross-sectional view of a substrate which includes a strip of silicon nitride. The silicon nitride layer is used to define the active region of the EEPROM cell in the currently preferred embodiment of the present invention.

FIG. 3 illustrates the substrate of FIG. 2 following field oxide growth.

FIG. 4 illustrates the substrate of FIG. 3 after a portion of the channel region of the device has been photolithographically masked. The remaining portion of the channel is shown being subjected to an ion implantation of argon.

FIG. 5 illustrates the substrate of FIG. 4 following photoresist strip and tunnel oxide growth. A two-tiered tunnel oxide is shown.

FIG. 6 illustrates the substrate of FIG. 5 following formation of the polysilicon floating gate, the interpoly dielectric and the polysilicon control gate.

FIG. 7 illustrates the substrate of FIG. 3 following etching of the silicon nitride layer. FIG. 7 illustrates an alternative method of forming the two-tiered tunnel oxide structure in which an additional oxide layer is first formed over one portion of the channel while the other portion remains protected.

DESCRIPTION OF THE PREFERRED EMBODIMENT(S)

A method for creating a two-tiered gate oxide structure to prevent drain disturbance in electrically programmable and electrically erasable read-only memory (EEPROM) arrays is disclosed. In the following description, numerous specific details are set forth, such as specific conductivity types, thicknesses, voltages, etc., in order to provide a more thorough understanding of the present invention. It will be obvious, however, to one skilled in the art these specific details need not be used to practice the present invention. In other instances, other well-known structures and circuits have not been shown in detail in order to avoid unnecessarily obscuring the present invention.

With reference to FIG. 1, there is shown a portion of a memory array formed of rows and columns of EEPROM cells 14. Each EEPROM cell 14 comprises separate source and drain regions formed in a silicon substrate. The source and drain regions define a channel therebetween. A floating gate 11 is disposed above, and insulated from, the channel by a thin layer of silicon dioxide. Insulated from, and disposed above, the floating gate is a control gate electrode 13.

Typically, both the control gate and the floating gate are formed of polycrystalline silicon material, (i.e., polysilicon). In the case of flash EEPROMs, it is common for the drain region to be more sharply defined and shallower when compared to that of the source. Flash devices also typically have a source region which is more deeply diffused when compared to the drain. The deeper diffused source also extends into the channel region directly under the floating gate to facilitate erasing (i.e., removal of electrons from the floating gate). Each of the cells 14 located within a single column have their drain regions coupled to a common column line 12. Rows of individual cells 14 have their control gates 13 coupled to a row line 15.

To better understand the operation of the memory array shown in FIG. 1, consider the following example. Assume that it is desired to program EEPROM cell 14a. That is, electrical charge is to be injected from the channel region onto the floating gate 11a. To program cell 14a, column line 12a coupled to the drain region is raised to a positive potential of approximately 7 volts, while the source region remains grounded. Row line 15a is taken to a higher positive potential of approximately 10-12 volts. This causes a high electric field to be developed in the channel region near the drain. This E-field, as mentioned above, generates hot electrons which are then injected onto the floating gate 11a near the drain region. Obviously, the electrical field strength near the drain may be increased by making the drain junction shallower and more abrupt when compared to the source region. All of the remaining row lines within the array (e.g., 15b, etc.) are grounded during programming.

To erase cell 14a (i.e., to transfer electrons from floating gate 11a to the substrate) the source is taken to a high positive potential of approximately 10-12 volts, the control gate 13a is grounded and the drain is left floating. This causes Fowler-Nordheim tunnelling of electrons from the floating gate to the substrate through the thin gate oxide near the source.

As previously stated, drain disturbance occurs in adjacent cells during programming of a selected cell due to the fact that each of the transistors 14 have their drains commonly coupled to a single column line 12. For example, if cell 14a is being programmed, then the drain of cell 14b is also at a potential of approximately 7 volts. Due to the fact that the control gate 15b is grounded during the programming of cell 14a, an erase-like condition is developed in cell 14b. That is, electrons residing on the floating gate 11b are attracted to the drain region by the relatively high potential present on column line 12a. If the gate oxide is relatively thin near the drain (e.g., ~100 Å) then Fowler-Nordheim tunnelling of electrons may occur.

As is apparent to one skilled in the art, this type of disturbance to the programming state of adjacent cell 14b is disadvantageous. To alleviate this problem, the present invention provides for a thicker gate oxide near the drain region to reduce drain disturbance while retaining a relatively thin gate oxide near the source to avoid interfering with the erase performance of individual cells.

In accordance with the method of the present invention the preferred embodiment of the invented process is readily compatible with conventional EPROM and EEPROM process flows. In other words, the presently invented method for forming a two-tiered tunnel oxide structure may be assimilated into a variety of process flows—each incorporating a variety of different steps both preceding and succeeding tunnel oxide growth—without departing from the spirit or scope of the present invention.

Referring to FIG. 2, there is shown a cross-sectional view of a p-type substrate material 20 on which a silicon nitride ($Si_3N_4$) layer 21 has been patterned. Layer 21 defines the active area of the EEPROM device. Usually, the starting material of substrate 20 is a silicon crystal having a <100> orientation.

After silicon nitride layer 21 has been patterned, field oxide regions 22 are formed. Field oxide 22 is formed in a furnace at 1,000° C. for approximately 40 minutes in an atmosphere of $O_2$. The thickness of field oxide regions 22 is on the order of several thousand angstroms. Note that each of field oxide regions 22 also extends slightly under silicon nitride layer 21. This lateral encroachment is known as a "birds-beak" and results in slight lifting of the edges of nitride layer 21. The channel region for the EEPROM cell to be fabricated is shown in FIG. 3 as being located largely in region 25, directly under layer 21.

Referring now to FIG. 4, following growth of the field oxide, silicon nitride layer 21 is removed. Next, a layer of photoresist 27 is patterned over the substrate using ordinary photolithographic techniques. The patterning is such that photoresist layer 27 covers a portion 25a of the underlying channel region while exposing another portion 25b.

An argon ion implant 28 is then performed on the device such that exposed region 25a receives the dose from implant 28, while the protected region 25a does not. Implanting argon into channel region 25b damages the underlying lattice structure in the silicon substrate in that region. This sort of intentional damage by ion implantation of a non-electrically active species such as argon enhances subsequent thermal oxidation in the implanted silicon. In the preferred embodiment, argon is implanted at an energy of 40 KeV and at a dose of approximately $4.0 \times 10^{14}$ atoms per square centimeter.

Other species are also effective in enhancing the thermal oxidation rate. Antimony, argon, arsenic, and boron, or any one of the group III-IV dopants, have proven effective for enhancing oxidation rates in silicon.

With reference to FIG. 5, after the argon implant has been completed, photoresist layer 27 is stripped and thermal oxidation of the channel may proceed. The thermal oxidation takes place in a furnace at a temperature of around 950° C. for a period of approximately 10 minutes in a dry $O_2$ atmosphere. During the gate oxide growth, the oxidation rate over channel region 25b is higher than that associated with channel region 25a due to the previous ion implant damage to the lattice. The result of this oxidation is shown in FIG. 5 wherein oxide 31 above region 25b is comparatively thicker than oxide 30 over region 25a. Preferably, oxide 31 is grown approximately 120 Å thick and oxide 30 is grown approximately 90 Å thick.

Following growth of the two-tiered tunnel oxide structure, the fabrication of the device may be completed according to any one of a number of well-known fabrication techniques. Usually, a polysilicon layer is first deposited over the surface of the device followed by an insulative material—most often silicon dioxide. A second layer of polysilicon is then deposited over the silicon dioxide and the entire structure is etched so that floating gate member 33 and control gate member 35 are formed over the tunnel oxide regions 30 and 31. Drain region 37 and source region 36 may then be formed by ordinary self-aligned ion implantation techniques.

Note that in FIG. 6, the n+ source region 36 is deeper and more graded when compared to the drain region 37; the drain being sharply defined and shallow when compared to the source. This is ordinarily accomplished by an additional source implant and diffusion. Note also that source region 36 extends under floating gate 33 and oxide 30 to facilitate Fowler-Nordheim tunnelling during erasing.

While the preferred embodiment contemplates ion implantation to enhance oxidation rates in one portion of the channel, other methods of attaining a two-tired gate oxide are also possible. For example, FIG. 7 illustrates an alternative method of achieving the same result. In the process flow of FIG. 7, after the field oxide regions 22 have been formed, a silicon nitride layer 40 is patterned over the device in a manner similar to that of photoresist layer 27 as shown in FIG. 4. In other words, silicon nitride layer 40 extends or covers a portion 25a of the channel region while leaving exposed another portion 25b. Subsequent thermal oxidation of the device will product an oxide 41 over region 25b. At the same time, no oxide growth takes place in 25a due to the presence of layer 40. After layer 40 is removed, an additional thermal oxidation cycle produces the structure shown in FIG. 5.

Whereas many alternations and modifications of the present invention will no doubt become apparent to a person of ordinary skill in the art after having read the foregoing description, it is to be understood that the particular embodiments shown and described by way of illustration are in no way intended to be considered limiting. For instance, although the preferred embodiment employs silicon nitride as a masking and protective layer, other materials or techniques are also possible. In addition, selective threshold ion implantation, wherein the channel regions under each of the two oxide tiers is given a different implant dose, may also be used in conjunction with the present invention to provide further program/erase benefits. Therefore, reference to the details of the preferred embodiments are not intended to limit the scope of the claims which themselves recite only those features regarded as essential to the invention.

Thus, a process for forming a two-tiered gate oxide structure aimed at reducing drain disturbance in EEPROM arrays has been described.

I claim:

1. In a process for fabricating an array of electrically programmable and electrically erasable read-only memory cells of the type which include a floating gate and which are programmed by hot-electron injection near the drain region and erased by Fowler-Nordheim tunnelling near the source, a method for suppressing drain disturbance in adjacent cells during programming of a selected cell, wherein the respective drains and sources of said selected cell and said adjacent cells are coupled together in said array, said method comprising the steps of:
   damaging the lattice structure in a portion of the channel near said drain region of each of said cells in said array so as to enhance subsequent thermal oxidation therein, said portion occupying less than half of the total area of said channel; and
   thermally oxidizing said channel to form a tunnel oxide, said tunnel oxide being thicker over said portion when compared to the remainder of said channel to inhibit Fowler-Nordheim tunnelling of electrons from said floating gate to said drain.

2. The method of claim 1 wherein said damaging step comprises the step of implanting said portion with ions of a species known to be effective in enhancing subsequent thermal oxidation of silicon.

3. The method of claim 2 wherein said species is selected from the group consisting of: argon, boron, antimony and arsenic.

4. The method of claim 3 wherein the thickness of said tunnel oxide over said portion of said channel is approximately 120 Å.

5. The method of claim 4 wherein said drain region is sharply defined and shallow when compared to said source region.

6. In a process for fabricating an array of electrically programmable and electrically erasable read-only memory cells of the type which are programmed by hot electron injection at a first portion of the channel nearest the drain region and erased by Fowler-Nordheim tunnelling at a second portion of the channel nearest the source region, an improvement for reducing drain disturbance in adjacent cells during programming of a selected cell comprising the steps of:
   covering said second portion of said channel with a protective layer while leaving exposed said first portion, said second oportion having an area which is greater than or equal to the area of said first portion;
   implanting said first portion with ions of a species known to be effective in enhancing subsequent thermal oxidation thereof;
   removing said protective layer; and
   thermally oxidizing said channel to form a tunnel oxide, said tunnel oxide being thicker over said first portion when compared to said second portion to inhibit Fowler-Nordheim tunnelling of electrons near said drain.

7. The method of claim 6 wherein said species is selected from the group consisting of argon, boron, antimony and arsenic.

8. The method of claim 7 wherein said protective layer comprises photoresist.

9. The method of claim 8 wherein the thickness of said tunnel oxide over said first portion is approximately 120 Å, and the thickness of said tunnel oxide over said second portion is approximately 90 Å.

10. The method of claim 9 wherein said drain region is sharply defined and shallow when compared to said source region.

11. The method of claim 10 wherein said species comprises argon implanted to an energy of 40 KeV.

12. In a process for fabricating an array of electrically programmable and electrically erasable read-only memory cells in a silicon substrate, said cells being of the type which include source and drain regions separated by a channel with a floating gate being disposed above and insulated from said channel by a gate oxide, said cells being programmed by hot electron injection from said substrate to said floating gate through a first portion of said gate oxide near said drain, and erased by Fowler-Nordheim tunnelling of electrons from said floating gate to said substrate through a second portion of said gate oxide near said source, an improvement for suppressing drain disturbance in adjacent cells during programming of a selected cell comprising the steps of:
   masking the channel of each of said cells with a first layer of material;
   forming field oxide regions in said substrate areas exclusive of said first layer;
   removing said masking layer;
   patterning a second layer of material over said substrate so as to protect a second region of said channel near said source while exposing a first region of said channel near said drain, said first region having an area which is less than or equal to the area of said second region;
   implanting said first portion of said channel with ions of a species known to be effective at enhancing thermal oxidation in silicon;
   removing said second layer; and
   thermally oxidizing said channel to grow said gate oxide over said channel, said first portion of said gate oxide being formed over said gate oxide over said first region and said second portion being formed over said second region of said channel, said first region being thicker then said second region so as to inhibit Fowler-Nordheim tunnelling of electrons near said drain.

13. The method of claim 12 wherein said first layer of material comprises silicon nitride.

14. The method of claim 13 wherein said second layer of material comprises photoresist.

15. The method of claim 14 wherein said gate oxide comprises silicon dioxide.

16. The method of claim 15 wherein said drain region is sharply defined and shallow when compared to said source region.

17. The method of claim 16 wherein said species is selected from the group consisting of argon, boron, antimony and arsenic.

18. The method of claim 17 wherein said first portion of said gate oxide is approximately 120 Å thick.

19. The method of claim 18 wherein said second portion of said gate oxide is approximately 90 Å thick.

20. The method of claim 19 wherein said species comprises argon implanted at an energy of 40 KeV.

21. In a process for fabricating an array of electrically programmable and electrically erasable read-only memory cells in a silicon substrate, said cells being of the type which include source and drain regions separated by a channel with a floating gate being disposed above and separated from said channel by a gate oxide, said cells being programmed by hot electron injection from said substrate to said floating gate near said drain region and erased by Fowler-Nordheim tunnelling from said floating gate to said substrate near said source region, an improvement for reducing drain disturbance in adjacent cells during programming of a selected cell comprising the steps of:

covering a first portion of said channel near said source region with a protective layer while leaving exposed a first portion near said drain region said first portion having an area which is less than or equal to the area of said first portion;

forming a first oxide over said second portion;

removing said protective layer; and thermally oxidizing said channel to grow said gate oxide, said gate oxide being thicker over said second portion when compared to said first portion to inhibit Fowler-Nordheim tunnelling of electrons near said drain region.

22. The method of claim 21 wherein the thickness of said gate oxide over said second portion is approximately 120 Å.

23. The method of claim 22 wherein the thickness of said gate oxide over said first portion is approximately 90 Å.

24. The method of claim 23 wherein said protective layer comprises photoresist.

25. The method of claim 24 wherein said drain region is sharply defined and shallow when compared to said source region.

26. The method of claim 1 further comprising the step of selectively implanting ions into said channel such that the threshold voltage of said portion differs from that of said remainder.

* * * * *